United States Patent
Yamada

(10) Patent No.: US 10,957,402 B2
(45) Date of Patent: Mar. 23, 2021

(54) HIGH-VOLTAGE SHIFTER WITH DEGRADATION COMPENSATION

(71) Applicant: Micron Technology, Inc., Boise, ID (US)

(72) Inventor: Shigekazu Yamada, Suginamiku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/259,610

(22) Filed: Jan. 28, 2019

(65) Prior Publication Data

US 2020/0243145 A1   Jul. 30, 2020

(51) Int. Cl.

| | |
|---|---|
| *G11C 16/30* | (2006.01) |
| *G11C 16/08* | (2006.01) |
| *G11C 16/16* | (2006.01) |
| *G11C 16/24* | (2006.01) |
| *G11C 5/14* | (2006.01) |
| *G11C 16/34* | (2006.01) |
| *G11C 5/06* | (2006.01) |
| *G11C 16/26* | (2006.01) |

(52) U.S. Cl.
CPC .............. *G11C 16/30* (2013.01); *G11C 5/063* (2013.01); *G11C 5/145* (2013.01); *G11C 5/147* (2013.01); *G11C 16/08* (2013.01); *G11C 16/16* (2013.01); *G11C 16/24* (2013.01); *G11C 16/26* (2013.01); *G11C 16/34* (2013.01)

(58) Field of Classification Search
CPC ......... G11C 16/30; G11C 16/26; G11C 16/16; G11C 16/08; G11C 16/24; G11C 16/34; G11C 5/063; G11C 5/145; G11C 5/147
See application file for complete search history.

(56) References Cited

U.S. PATENT DOCUMENTS

| | | | |
|---|---|---|---|
| 10,432,192 B1* | 10/2019 | Kaur | G06F 1/24 |
| 2007/0070703 A1* | 3/2007 | Tran | G11C 8/10 |
| | | | 365/185.22 |
| 2007/0279091 A1 | 12/2007 | Goel et al. | |

(Continued)

OTHER PUBLICATIONS

"International Application Serial No. PCT/US2020/015196, International Search Report dated May 19, 2020", 3pgs.

(Continued)

*Primary Examiner* — Sultana Begum

(74) *Attorney, Agent, or Firm* — Schwegman Lundberg & Woessner, P.A.

(57) ABSTRACT

Discussed herein are systems and methods for compensating degradation of a transistor in a high-voltage (HV) shifter configured to transfer an input voltage to an access line, such as a global wordline. An embodiment of a memory device comprises a group of memory cells, and a HV shifter circuit including a signal transfer circuit and a compensator circuit. The signal transfer circuit includes a P-channel transistor to transfer a high-voltage input to an access line. The compensator circuit can provide a control signal to the signal transfer circuit by coupling a support voltage higher than a supply voltage (Vcc) to the signal transfer circuit for a specified time period to compensate for degradation of the P-channel transistor. The transferred high voltage is used to charge the access line to selectively read, program, or erase memory cells.

20 Claims, 14 Drawing Sheets

(56) References Cited

U.S. PATENT DOCUMENTS

| | | |
|---|---|---|
| 2009/0168586 A1 | 7/2009 | Chan et al. |
| 2009/0185422 A1 | 7/2009 | Kang et al. |
| 2012/0081172 A1 | 4/2012 | Huynh et al. |
| 2016/0378232 A1* | 12/2016 | Hsu ..................... G09G 3/3677 345/174 |
| 2017/0301402 A1 | 10/2017 | Kuribara et al. |
| 2020/0051653 A1* | 2/2020 | Kurjanowicz ...... H01L 27/0203 |

OTHER PUBLICATIONS

"International Application Serial No. PCT/US2020/015196, Written Opinion dated May 19, 2020", 6 pgs.

* cited by examiner

HIGH-VOLTAGE SHIFTER WITH DEGRADATION COMPENSATION

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (IMAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

During a typical programming operation of a flash memory cell (e.g., a NAND flash memory), a selected word line coupled to the selected memory cell to be programmed can be biased with a series of incrementing voltage programming pulses that start at an initial voltage that is greater than a predetermined programming voltage ($V_{PGM}$). The programming pulse increases a charge level, thereby increasing the cell threshold voltage Vth, on a floating gate of the memory cell. A charge pump circuit may be used in a non-volatile memory device such as a NAND flash memory to generate the voltages required for chip operation. A charge pump is an electronic circuit that uses capacitors as energy storage elements to convert DC voltages into other DC voltages. After each programming pulse, a verification operation with a word line voltage of 0V is performed to determine if the cell threshold voltage has increased to the desired programmed level.

High-voltage (HV) shifters, or HV level shifters, have been used in various memory devices (e.g., NAND flash memory) to provide desired voltages at different magnitude to selectively operate a memory cell, such as read, program, or erase a memory cell. In a memory device, components or subcircuits may have different voltage requirements to fulfill respective functions. A HIV shifter may serve as an interface between different logic device components to translate signals from one logic level or voltage domain to another logic level of voltage domain, thereby enabling compatibility among the voltage levels of different components or subcircuits. Providing appropriate operating voltages to specific circuit components can increase reliability of a memory device and decrease power consumption. In an example, a HV level shifter circuit may be used to translate a block wordline (WL) signal of a high voltage to different memory array blocks, such as in response to a block selection signal. In response to the block WL signal received from the HV level shifter, driving voltages may be provided to the WLs corresponding to various memory cell array block. An exemplary application of HV level shifters to translate a high-voltage input to one or more WLs is discussed in FIG. 5 below.

Figure 6:
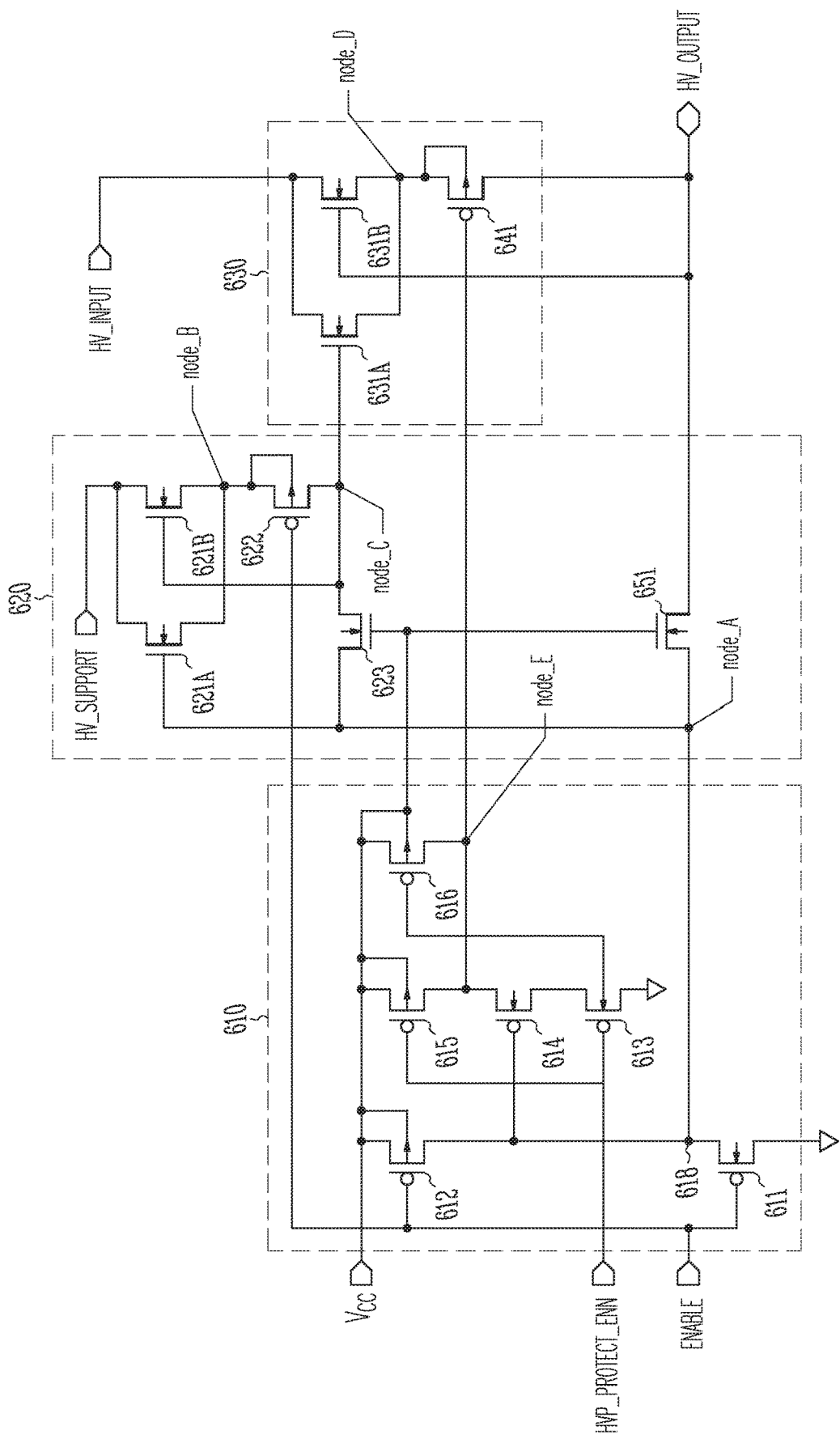
FIG. 6 is a schematic diagram illustrating a prior art high-voltage (HV) shifter 600.

In today's 3D NAND flash memory, the required number of HV shifters is increasing, as the high-voltage supply system gets complicated. Reducing HV shifter size and complexity (e.g., reducing the number of transistors in a HV shifter), and thereby reducing chip layout area and die size, have become an important requirement in modern memory device design. One of the technological challenges in reducing HV shifter size and complexity has to do with degradation of sensitive transistors in a HV shifter. For example, FIG. 6 is a schematic diagram illustrating a prior art high-voltage shifter that includes a number of HV transistors. Some of these HV transistors, such as high-voltage PMOS transistors (HVP's) on a path between an input port for receiving a high-voltage input and an output port connecting to an access line, are under a high-voltage stress. Some transistors may degrade after many cycles of repetitive use. For example, under the stress imposed by a high gate-to-channel voltage gradient (also referred to as "V_gate-V_channel" stress), a MT can degrade, represented by an increased threshold voltage (Vth) over time. To compensate for such degradation, many components are included in the HV shifter. This may take more chip space and increase FIN shifter complexity and cost.

The present inventor has recognized an improved solution to transistor degradation in a HV shifter, including a HV shifter circuit, and methods of using the same, that can compensate degradation of HV transistors in a HV shifter circuit, while at the same reducing the components and complexity of the shifter and overall size of a chip. In various embodiments, this document discusses, among other things, a memory device that comprises a group of memory cells, and a HV shifter circuit including a signal transfer circuit and a compensator circuit. The signal transfer circuit includes a P-channel transistor configured to transfer a high-voltage input to an access line. The compensator circuit can provide a control signal to the signal transfer circuit by coupling a support voltage to the signal transfer circuit for a specified time period to compensate for degradation of the P-channel transistor. The transferred high voltage can be used to charge the access line to selectively read, program, or erase memory cells. Methods of forming such apparatus are also disclosed, as well as methods of operation, and other embodiments.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 1:
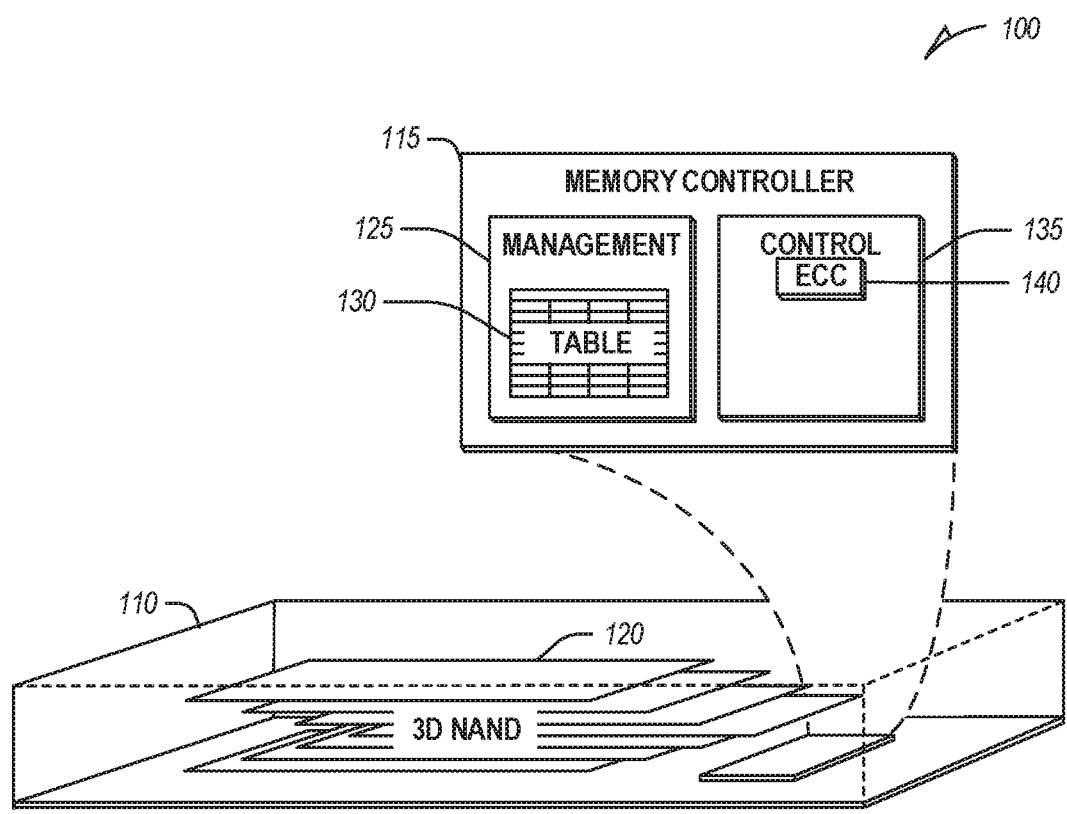
FIG. 1 illustrates an example of an environment including a memory device.

FIG. 1 illustrates an example of a memory device 110 that may be included in a variety of products, such as Internet of Things (IoT) devices (e.g., a refrigerator or other appliance, sensor, motor or actuator, mobile communication device, automobile, drone, etc.) to support processing, communications, or control of a product. The memory device 110 includes a memory controller 115 and a memory array 120. The memory array 120 may include a number of individual memory die (e.g., a two-dimensional (2D) NAND die, or a stack of three-dimensional (3D) NAND die). The memory arrays 120 can be 2D structures arranged on a surface of a semiconductor substrate. To increase memory capacity for a given area, and to decrease cost, the size of the individual memory cells has decreased. Alternatively, memory arrays 120 can be 3D structures, such as 3D NAND memory devices that can further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of a host device. In other examples, the memory device 110 can be a portion of an integrated circuit (e.g., system on a chip (SOC), etc.), stacked or otherwise included with one or more other components of a host device.

The memory controller 115 can communicate with the memory array 120, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between a host and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between a host and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
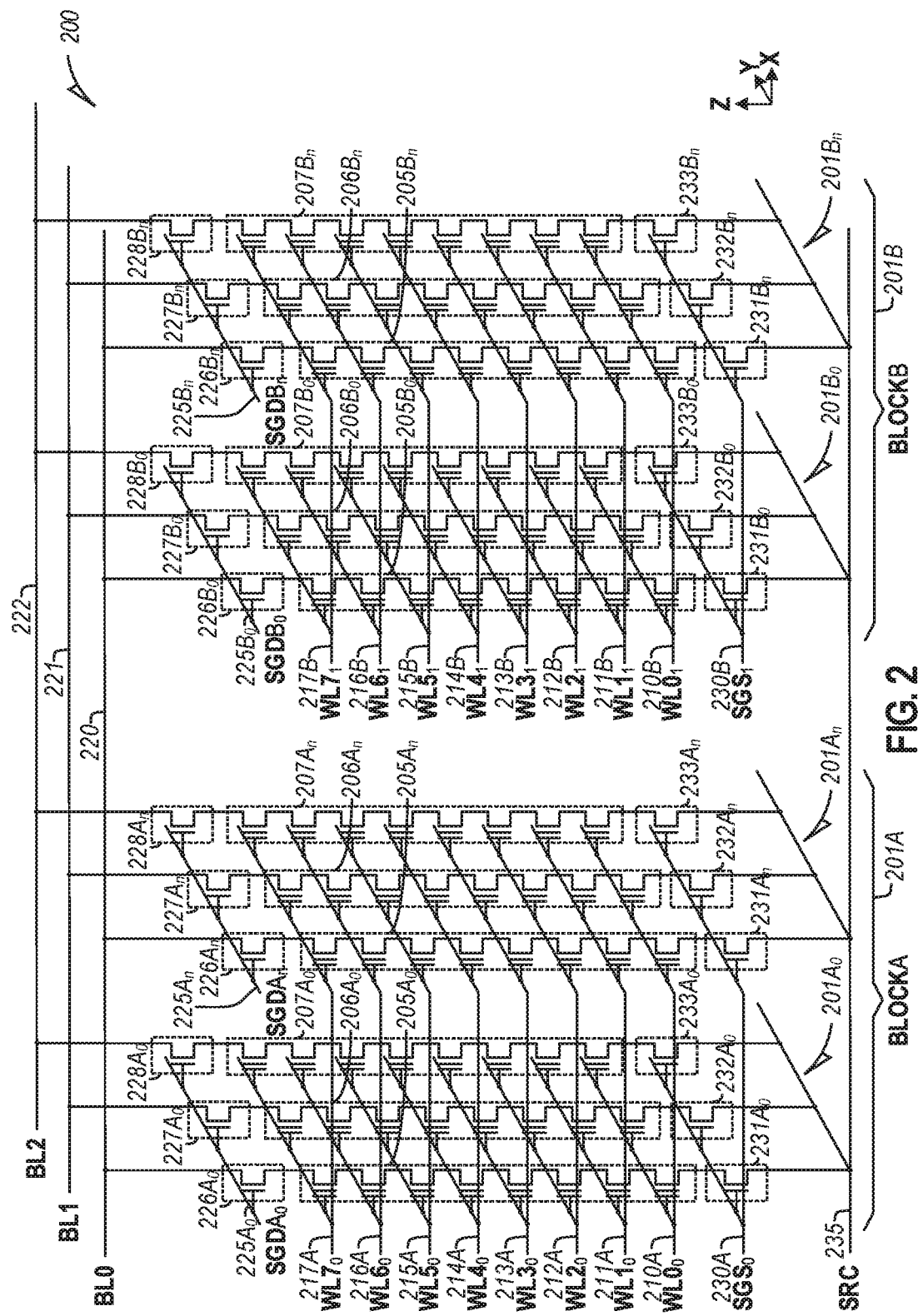
FIGS. 2-3 are schematic diagrams illustrating examples of NAND architecture semiconductor memory array.

FIG. 2 is a schematic diagram illustrating an example of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third A SGD $226A_n$-$228A_n$, first-third $B_n$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CO) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line SGD $A_0$ $225A_0$, first-third $A_n$ SGD $226A_n$-$228A_n$ can be accessed using an SGD line $SGDA_n$$225A_n$, first-third $B_0$ SGD $226B_0$-$228B_0$ can be accessed using an $B_0$ SGD line $SGDB_0$$225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed via a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., WLs).

Figure 3:
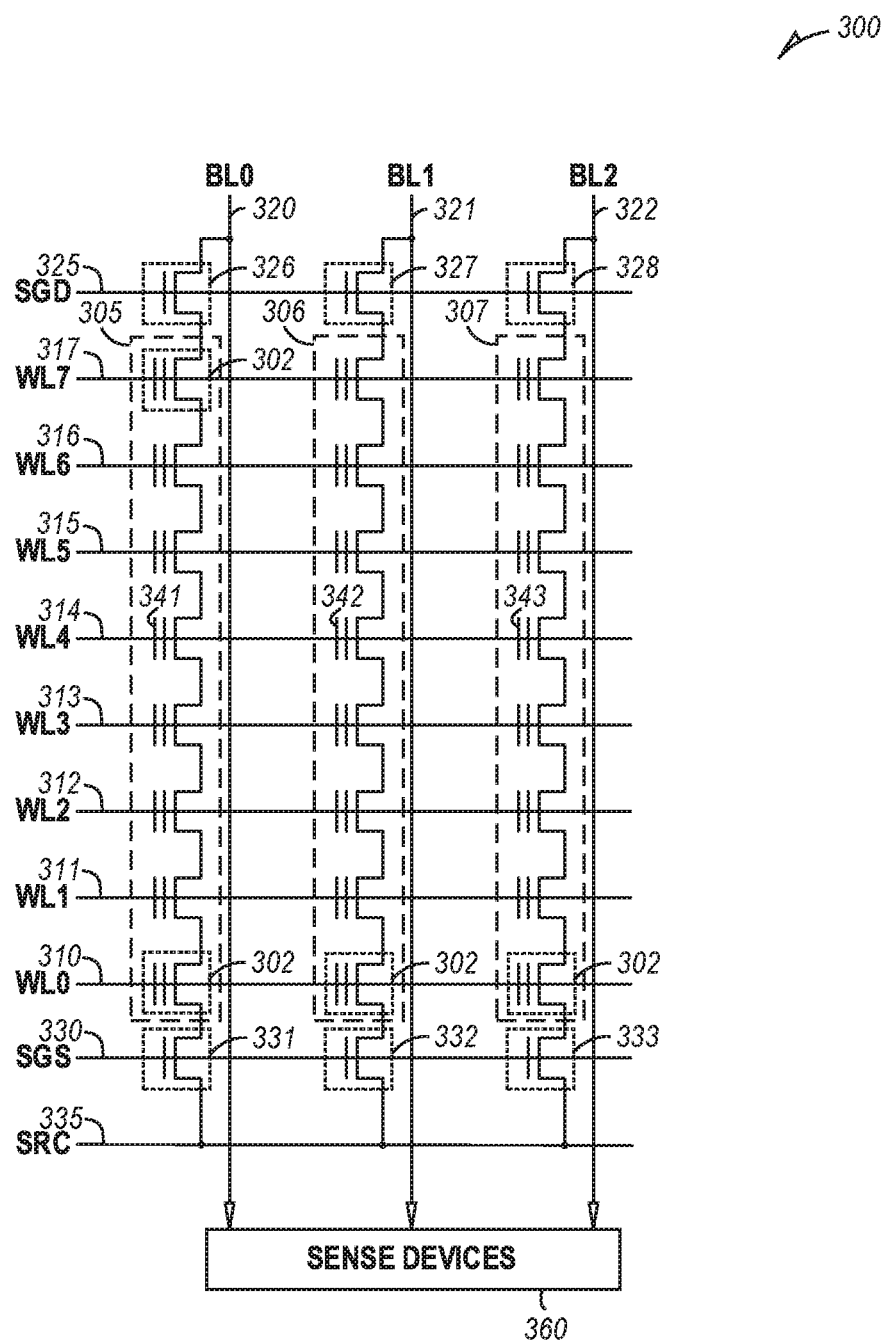

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access fines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control grates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential $V_{SS}$, can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage ($V_{PASS}$) can be applied to one or more word lines having memory cells that are not targeted for programming, or an inhibit voltage (e.g., Vcc can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e a battery, an AC-to-DC converter, etc.), relative to a ground potential $V_{SS}$.

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number) the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground $V_{SS}$, resulting in a charge transfer (e.g., direct injection or Fowler-Nordheim (EN) tunneling, etc.) from the floating gates of the targeted memory cells to the channels.

Figure 4:
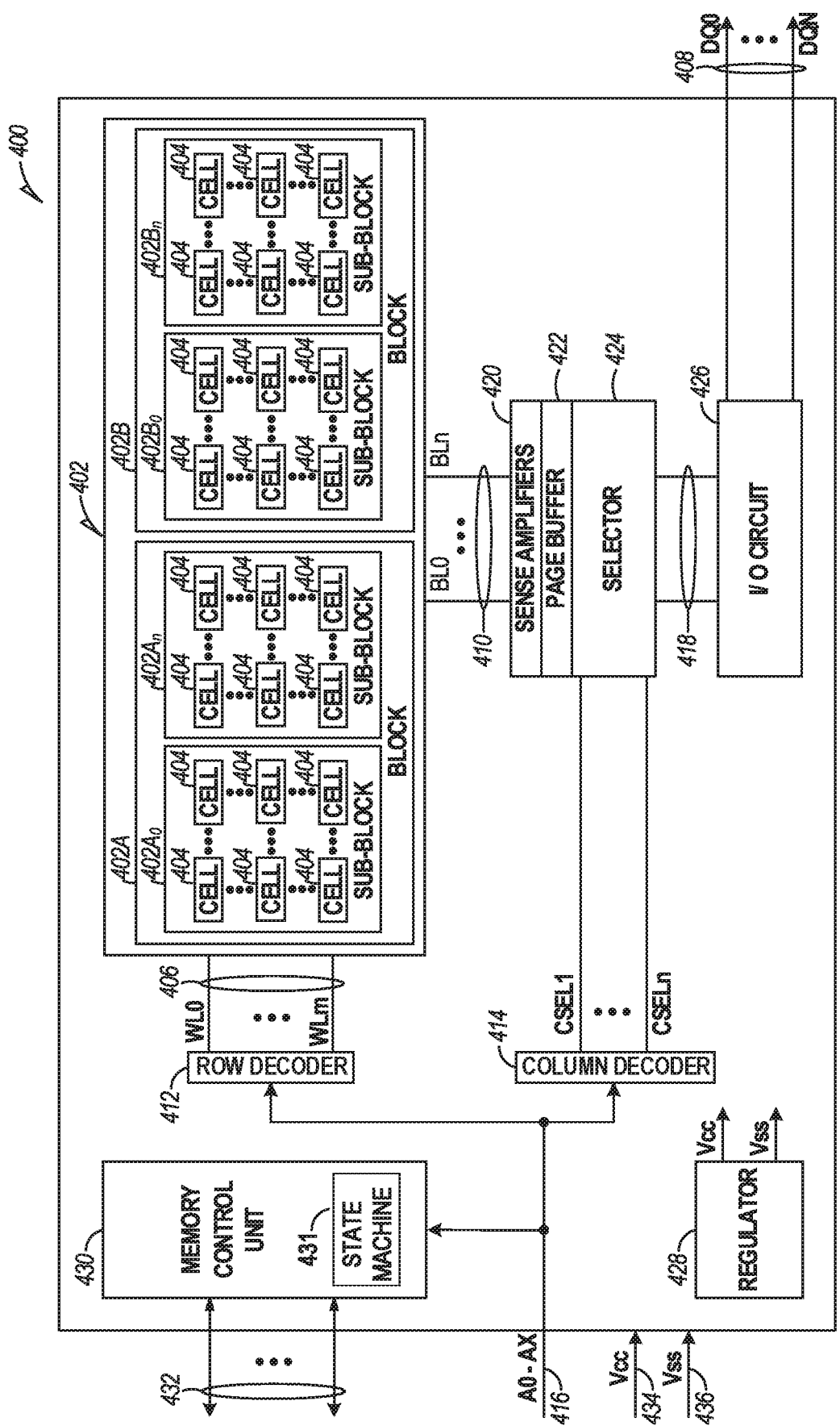
FIG. 4 is a block diagram illustrating an example of a memory module.

FIG. 4 is a block diagram illustrating an example of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A₀, 402Aₙ, and the second block 402B can include first and second sub-blocks 402B₀, 402Bₙ. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 may include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage Vcc 434 and a ground potential $V_{SS}$ 436, from an external source or supply (e.g., an internal or external battery, an AC-to-DC converter, etc.). In certain examples, the memory control unit 430 can include a regulator 428 to internally provide positive or negative supply signals.

Figure 5:
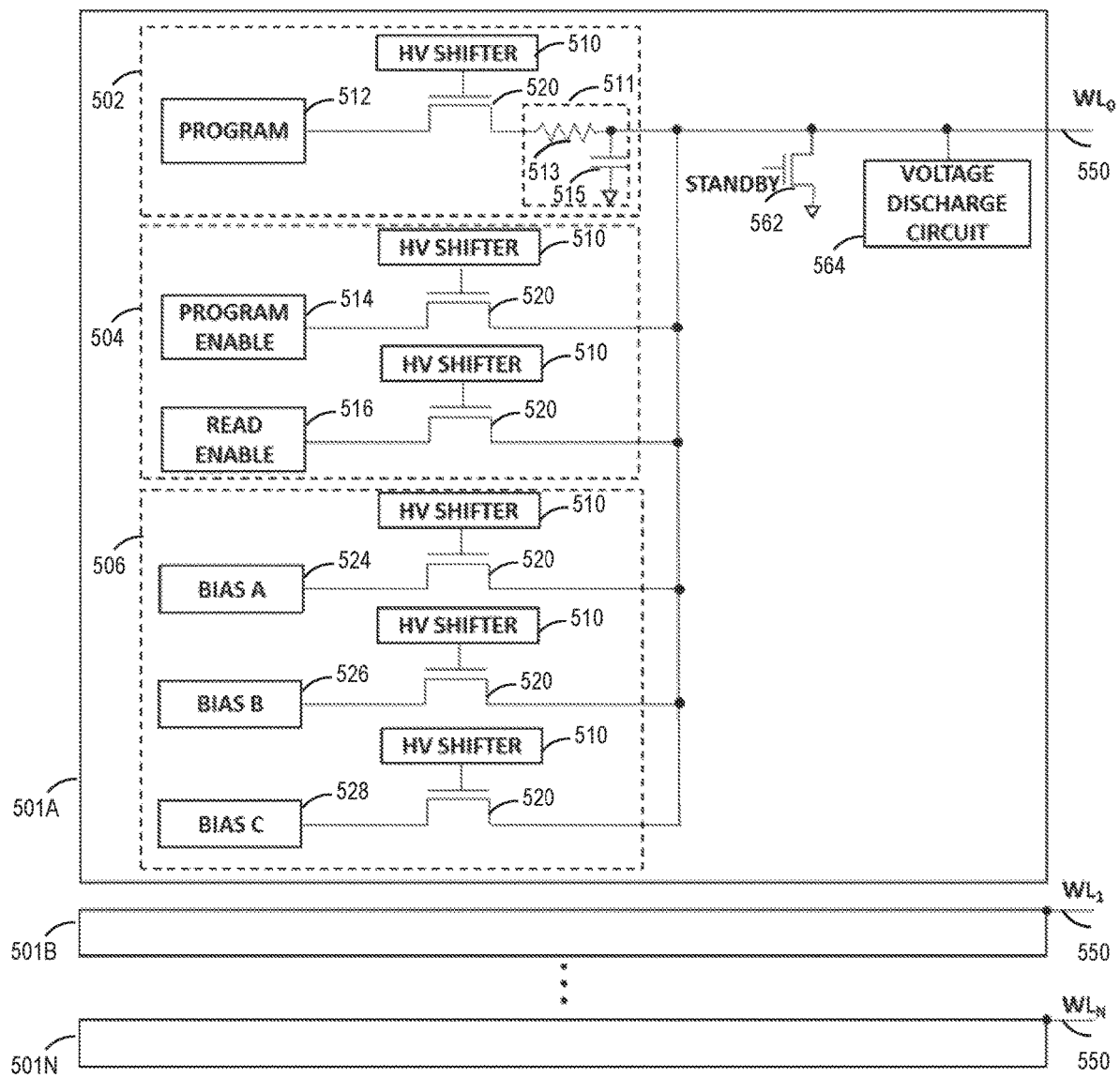
FIG. 5 is a block diagram illustrating prior art word line (WL) drivers in a row decoder.

In various examples, a row decoder of a memory device, such as the row decoder 412 of FIG. 4, may include high-voltage (HV) shifters configured to translate supply voltage of specific magnitudes to access lines (e.g., a global word line (GWL)) of memory cells. FIG. 5 is a block diagram illustrating an example of prior art word line (WL) drivers 501A-501N in a row decoder. The WL drivers 501A-501N can be provided for all of the WLs 550 in a block. Each WL driver can include a HV shifter to couple one of several possible voltages to a respective WL to program, erase, or read the memory cells in the respective row. Taking WL driver 501A as an example, each WL driver can include several voltage nodes 512-528 configured to receive a supply voltage having a respective magnitude. The voltage nodes 512-528 are coupled to the respective WL 550 through a switch 520 enabled in accordance with the operation of the selected row of memory cells. The switches 520 can be NMOS transistors controlled by a HV shifter 510, such as a charge pump circuit (not shown) or by other means known to one skilled in the art. When enabled, the HV shifter 510 provides a voltage to turn ON the transistor switch 520 and couple the respective voltage nodes 512-528 to the selected WL 550. Additionally, each WL driver can include a standby switch 562 and a voltage discharge circuit 564 coupled to the WL 550. The standby switch 562 is enabled when the memory block is inactive, and disabled when the memory block receives a command for a memory operation. The voltage discharge circuit 564, which conventionally includes a high impedance for causing any voltage capacitively stored on the respective WL 550, including voltage stored on capacitors coupled to the WL 550 such as a capacitor 515, to be discharged after a memory operation is complete to prepare for the next command.

The WL driver 501 includes a program block 502 to apply a programming voltage to one of the WL 550 selected for programming during a programming operation, a read block 506 to apply one of several read voltages to a WL 550 selected for reading during a read operation, and an enable block 504 to apply one of two enable voltages to a non-selected WL 550 during either a programming or reading operation. The program voltage supplied by the program block 502 must be sufficiently large to store charge on the floating gate when the selected memory cell is programmed. When the switch 520 is enabled, the program node 512 is serially connected to a resistor 513 and a capacitor 515, which in combination act as a low pass filter 511 that filters the supplied voltage before the voltage is applied to the WL 550. The low pass filter 511 is used as a delay element to minimize disturbances due to WL-to-WL coupling when the signal applied to the WL 550 transitions to a high voltage level or a low voltage level. During the program operation, the enable block 504 applies a program enable voltage from the program enable node 514 to a respective one of the WLs 550 that is not selected for programming. As described above, a voltage sufficient to turn on all the unselected memory cells 14 must be applied to the WLs 550 of the other rows to program the selected row.

Similarly, during a read operation, the read block 506 applies a read voltage to a respective WL 550 that is selected for reading. Since the memory cell is capable of storing multiple bits of data at multiple levels of charge on its floating gate, several read voltages are made available through one or more bias voltage nodes 524-528. During the read operation, the enable block 504 applies a read enable voltage from the read enable node 516 to a respective one of the WLs 550 if the WL is not selected for reading to turn on the memory cells 14 of the non-selected rows as previously described.

As mentioned above, respective WL drivers 501A-501N are provided for all of the WLs 550 in a block. For example, for a block containing 32 rows of memory cells, 32 WL drivers 501 must be provided. The area on a semiconductor die that must be devoted to such WL drivers is further increased by the use of the multilevel memory cell in the flash memory block, since more voltage levels must be supplied by each of the WL drivers as more bits are stored in the memory cells. Specifically, each additional voltage that is supplied requires an additional voltage node to incorporate in the WL driver 501 circuitry or by some other circuitry. Therefore, as the number of read voltages supplied to the select memory cells increases, each of the drivers 501 require additional circuitry. Therefore, the memory chip must accommodate a greater number of the larger drivers 501, resulting in a large chip layout area and a large die size. The large number of components can require a significant amount of area on a semiconductor die, thus increasing the cost of non-volatile memory devices having row decoders that use the WL drivers 501. Therefore, there has been an unmet need for a non-volatile memory device and method that reduces the circuit size of the WL drivers 501 to reduce the overall memory chip layout area and die size.

As previously discussed, one challenge in the HV shifter design is degradation of sensitive transistors due to substantial gate-to-channel stress applied thereto. Compensation of such degradation typically require a large number of transistors in the HV shifter, which take more chip area and increase HV shifter complexity and cost. By way of example, FIG. 6 is a schematic diagram illustrating a prior art HV shifter 600 used for translate an input voltage received from an input port to an output port coupled to one or more access lines, such as a GWL or a WL in a block, to selectively read, program, or erase memory cells.

The HV shifter 600 includes a low-voltage control circuit 610, a compensator circuit 620, and a signal transfer circuit 630. The low-voltage control circuit 610 includes low-voltage transistors, including for example, PMOS transistors 612, 615, and 616, and NMOS transistors 611, 613, and 614. A supply voltage Vcc and a shifter enabling signal "enable" can be applied to the low-voltage control circuit 610 to control the conduction of the signal transfer circuit 630, and thereby the output voltage of the HV shifter 600. In particular, the "enable" signal is connected to the gates of the NMOS 611 and of the PMOS 612 that constitute an inverter. The NMOS 611 has a source connected to a ground potential $V_{SS}$, and the PMOS 612 has a source connected to a supply voltage Vcc. The output of said inverter, forming a node 618, is connected to the gates of the NMOS 614 and of the PMOS 615. The PMOS 615 has a source connected to Vcc, and a drain connected to the drain of NMOS 614. A compensator-enabling signal "HVP_protect_enn" is coupled to the gates of the NMOS 613 and of the PMOS 616 to control the delivery of a compensation signal, generated by the compensator circuit 620, to the signal transfer circuit 630. The PMOS 616 has a source connected to Vcc, and a drain connected to the drain of the NMOS 614. The PMOS 615, NMOS 614, and NMOS 613 are serially connected and coupled between Vcc and $V_{SS}$.

The compensator circuit 620 includes high-voltage transistors, such as a pair of high-voltage NMOS transistors HVD 621A and HVD 621B each having a negative threshold voltage (Vth), high-voltage NMOS transistors HVN 623 and HVN 651 each having positive Vth, and a high-voltage PMOS transistor (HVP) 622. The HVD 621A and 621B have a Vth of approximately −1.5V. The HVN 623 and 651 are normal high-voltage NMOS transistors each having a positive Vth of approximately 0.8V. The HVP 622 has a positive Vth of approximately 1.5V. A high-voltage support signal "HV_support" can be supplied to the drains of the HVD 621A-621B. The sources of HVD 621A-6213 are connected to the source of the serially connected HVP 622. The HV_support, through the HVD 621A-621B and HVP 622, provides a compensation signal to the signal transfer circuit 630 to compensate for transistor degradation therein.

The signal transfer circuit 630 can include a pair of high-voltage NMOS transistors (HVD) 631A and 631B each having a negative threshold voltage (Vth), and a HVP 641 serially connected to the HVD 631A-631B and coupled between a high-voltage input signal "HV_input" and an output node "HV_output." The HVD 631A-631B each have a Vth of approximately −1.5V. The HVP 641 has a positive Vth of approximately 1.5V. The drains of HVD 631A-631B are coupled to the HV_input signal. The drain of HVP 641 is connected to HV_output. The signal transfer circuit 630 couples the compensation signal to HVP 641 to compensate for degradation associated with an elevated threshold voltage (Vth) of HVP 641, due to the substantial gate-to-channel stress. Degradation can occur when a transistor, such as a high-voltage PMOS transistor (HVP) 641, operates under a high-voltage gate-to-channel stress. A representation of transistor degradation is an increased threshold voltage (Vth). With the increased Vth, the degraded transistor (e.g., HVP 641) may not be able to fully transfer the high input voltage (HV_input) to the output (HV_output) of the HV shifter, and then to the access lines (e.g., GWLs or WLs) to selectively operate on the memory cells. For example, in the absence of degradation, a biasing voltage of Vcc less the Vth of a high-voltage NMOS transistor (HVD) 631A or 631B (that is, Vcc−1.5V) may be sufficient to cause the HVD 631A-631B and HVP 641 conductive, due to the negative threshold voltages of HVD 631A-631B and of HVP 641 (which are approximately −1.5V). Keeping a relatively lower biasing voltage is desirable to protect the low-voltage transistors in the low-voltage control circuit 610 from breakdown. However, when HVP 641 becomes degraded and the Vth of HVP 641 has increased, the biasing voltage Vcc−1.5V would not be high enough turn on HVD 631A-631B and HVP 641 to reliably transfer full input voltage to the output port. As such, to compensate for degradation of HVP 641, a higher gate voltage may be required to operate the degraded transistor.

Figure 7:
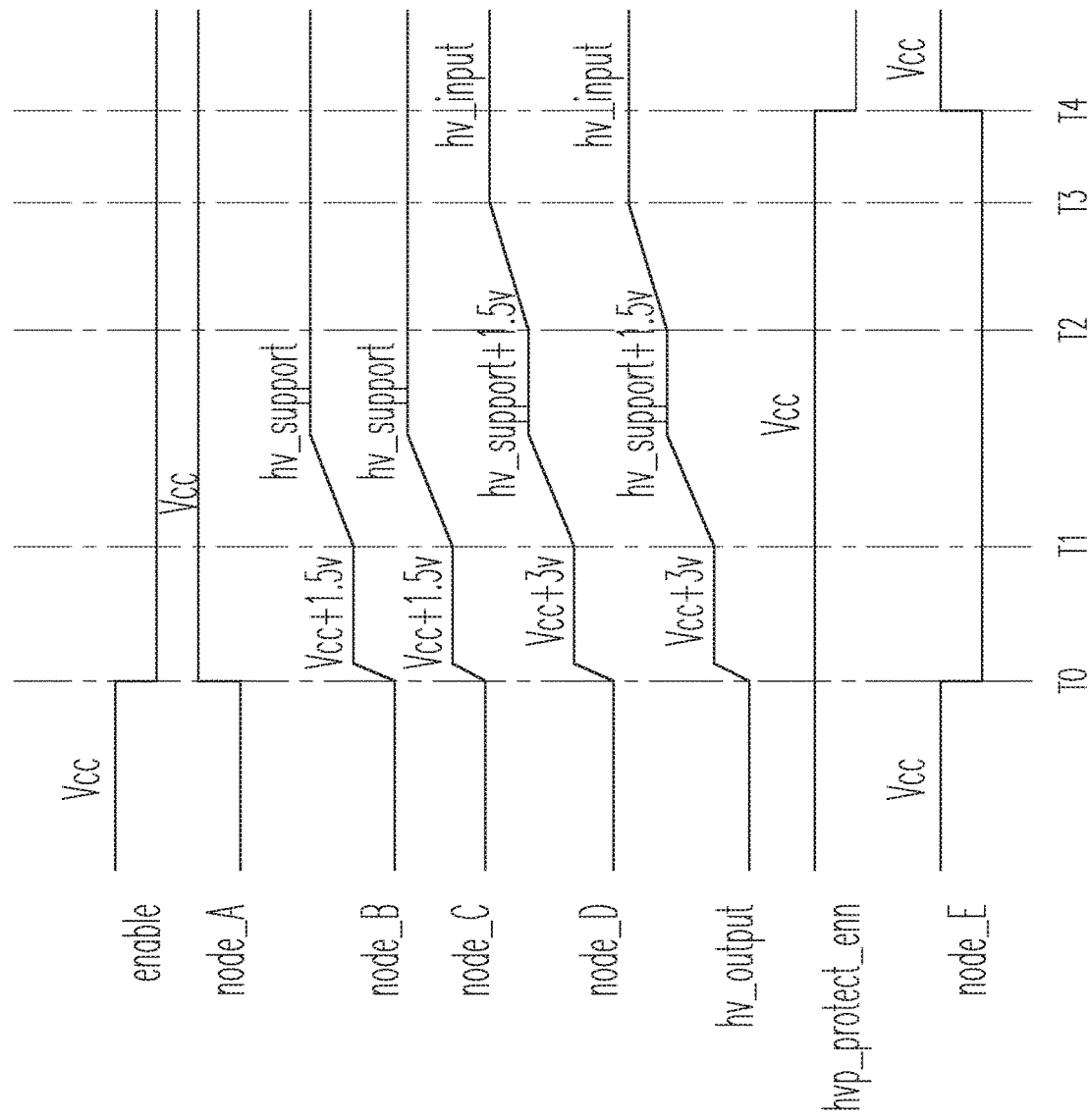
FIG. 7 is a timing diagram illustrating an operation of the HV shifter 600, including the voltage level shifting and compensation of transistor degradation.

FIG. 7 is a timing diagram illustrating an operation of the HV shifter 600, including the voltage level shifting and compensation of transistor degradation. Initially during the standby state, the shifter enabling signal "enable" is set to high at Vcc. The "enable" signal is coupled to the gate of the NMOS 611 and the PMOS 612 of the low-voltage control circuit 610, turning on NMOS 611 and shutting off PMOS 612. Node 618, and node_A, connected to the drain of NMOS 611, are pulled to a ground potential $V_{SS}$. The transistor HVN 623 has its gate connected to Vcc and drain connected to node_A. As HVN 623 conducts, node_C, which is connected to the source of HVN 623, is also low ($V_{SS}$). Node_A is connected to the gate of HVD 621A, and node_C is connected to the gate of HVD 621B. When both node-A and node_C are low, HVD 621A and 621B do not conduct. The sources of HVD 621A-621B, connected to node_B, are disconnected from HV_support connected to the drains of HVD 621A-621B. HVP 622 has a gate connected to "enable" (at a level of Vcc), thus does not conduct. As such, node_B stays at ground potential $V_{SS}$.

Node-C is connected to the gate of HVD 631A. The ground potential $V_{SS}$ at node_A is transferred to HV_ouput via a high-voltage NMOS transistor (HVN) 651 that conducts. The transferred low voltage is applied to the gate of HVD 631B. Because both node_A and node-C are low, the HVD 631A-631B are not conducting. Node_D, connected to the sources of HVD 631A-631B, is disconnected from HV_input; therefore, node_D stays at ground $V_{SS}$. The low voltage at node 618, connected to a gate of PMOS 615, turns on PMOS 615, setting node_E (connected to the drain of PMOS 615) to a logic high at Vcc.

At time T0, the "enable" signal is flipped to low (the ground potential $V_{SS}$) to enable the HV shifter. NMOS 611 is turned off and PMOS 612 is turned on, and node_A is raised to high at Vcc. HVD 621A thus conducts. As the HVD 621A has a negative threshold voltage (approximately −1.5V), the source of HVD 621A, connected to node_B, thus is raised to Vcc+1.5V. This is shown as the first voltage rise at node_B. HVP 622 conducts due to low gate voltage (connected to "enable"), which brings node_C to follow node_B, shown as the first voltage rise at node_C to Vcc+ 1.5V. The gates of HVD 621A-621B are connected to node_A and node_C, respectively. HVD 621A-621B each have a negative threshold voltage (Vth, approximately −1.5V). As HVD 621A-621B conduct, the sources of HVD 621A-6219 (connected to node_D) is raised to a level of higher than the gate voltage (connected to node_C) by 1.5V. As node_C is Vcc+1.5V, the voltage at node_D is approximately Vcc+3V.

The high voltage at node_A is connected to the gate of NMOS 614 to turn on NMOS 614. At this time, HVP_protect_enn is set to high, turning on the NMOS 613. Therefore, node_E is at a ground potential $V_{SS}$. HVP 641 has its gate connected to node_E, therefore conducts. Node_D is connected to the source of HVP 641, and HV_output is connected to the drain of HVP 641. The output voltage HV_ouput therefore follows node_D, reaching a potential of approximately Vcc+3V.

As HVD 621A-621B conduct, HV_support can be transferred down the path in the compensator circuit 620. From time T1, the voltage at node_B rises from Vcc+1.5V until HV_support is fully transferred, and raise node_B to HV_support. As HVP 622 still conducts, node_C follows node_B to rise to HV_support. This is shown in FIG. 7 as the second voltage rise at node_C and node_D to HV_support. As previously discussed, HVD 631A conducts, resulting in voltage of node_D (connected to the source of HVD 631A) being higher than the voltage at node_C (connected to the gate of HVD 631A) by Vth of HVD 631A. Therefore, when node_C rises from Vcc+1.5V to HV_support, node_D accordingly rises from Vcc+3.0V to HV_support+1.5V. The output voltage HV_ouput, via the conducted HVP 641, follows node_D voltage to rise to HV_support+1.5V. This is shown as the second voltage rise at node_D and HV_output to HV_support+1.5V.

As HVD 631A-631B conduct, HV_input can be transferred to down the path at the signal transfer circuit 630 node_D. Following a latency period when node_D reaches HV_support+1.5V, at time T2, the voltage at node_D can further rise from HV_support+1.5V until HV_input is fully transferred to node_D at time T3. The output voltage HV_ouput follows node_D voltage to rise to HV_input. This is shown as the third voltage rise at node_D and HV_support to HV_input.

HV_input can be selected according to memory cell operations. For example, when the HV shifter 600 is used to supply the HV_output to a word-line (e.g., a GWL) to read or program a memory cell, HV_input can be approximately 7-10V for reading a memory cell, or approximately 20-30V for programming a memory cell.

Transferring the high voltage HV_input through HVP 641 to HV_ouput to fulfill various high-voltage operations on the memory cells may subject HVP 641 to high-voltage "gate-to-channel" stress. This may elevate the threshold Vth and degrade the performance of HVP 641. FIG. 7 illustrates a solution to release the stress on HVP 641. After a prolonged voltage transfer through HVP 641, at time T4, HVP_protect_enn is reset to low at $V_{SS}$. PMOS 616, with its base connected to the compensator-enabling signal HVP_protect_enn and drain connected to node_E, conducts and raises the drain (and thus node_E) voltage to Vcc. The Vcc supplied to the gate of HVP 641 can relax the stress due to high-voltage transfer.

The prior art UV shifter 600 has several disadvantages. First, as illustrated in FIG. 7, after HV_Input has been fully transferred to HV_output through HVP 641, the gate of HVP 641 (at node_E) is switched to Vcc for the purpose of relaxing the stress applied to HVP 641. However, even with such relaxing, as HV_input remains to be high (e.g., approximately 30V), HVP 641 can continue degrade due to very high HV_input applied to HVP 641. Second, the HV shifter 600 comprises a large amount of high-voltage transistors, which take a lot of space and result in a large die size. To combat PMOS degradation, the compensator circuit 620 is included to compensate for the increased threshold voltage of HVP (e.g., HVP 641). Although HV-support higher than Vcc is able to turn on the degraded HVP 641 with an elevated Vth, the compensator circuit 620 comprises many high-voltage transistors (HVN 623, HVD 621A-621B, and HVP 622), which can increase the size, complexity, and cost of the HV shifter. Some of these high-voltage transistors are vulnerable to gate-to-channel stress particularly at high HV_support. As such, HV_support in HV shifter 600 is usually designed to be low enough (e.g., approximately 7V in an example) not to degrade HVP. Third, conventional HV shifters, such as the shifter 600, lacks resource sharing and may results in a large chip size. In a 3D NAND memory chip, there are usually many high-voltage sources and many word-lines. As illustrated in FIG. 5, each word-line driver (for driving a particular WL) requires a number of dedicated HV shifters. Eventually, a large number of HV shifters need to be implemented in a chip, which may substantially increase the chip size. For at least foregoing reasons, there is a need for a HV shifter with improved performance of compensating, or reducing, degradation of a transistor such as a high-voltage, while at the same time reducing the circuit size and complexity of the HV shifter, such that the overall chip layout area and die size can be reduced.

Figure 8:
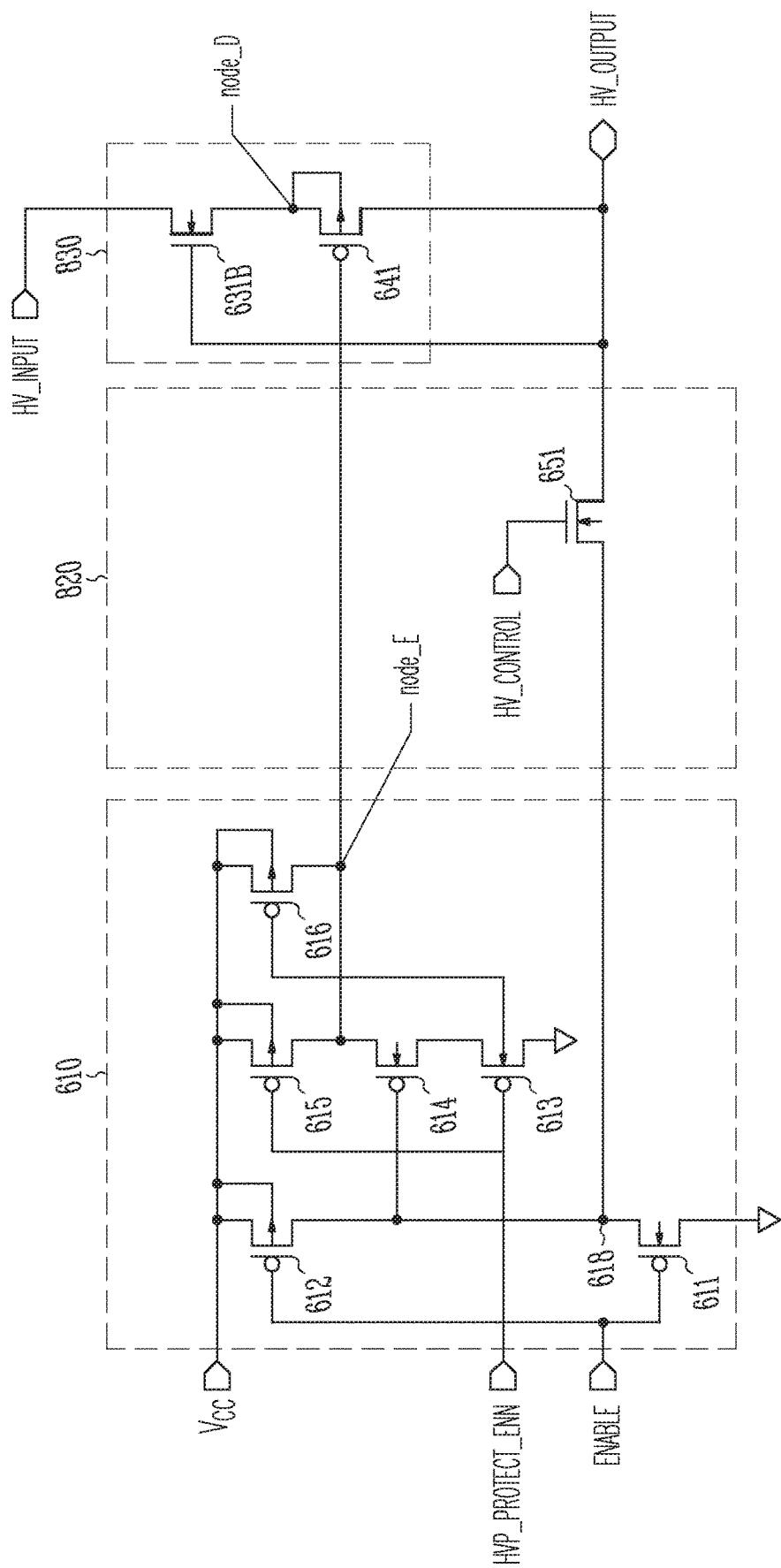
FIG. 8 is a schematic diagram illustrating an example of a HV shifter 800 with transistor degradation compensation, according to one embodiment discussed herein.

FIG. 8 is a schematic diagram illustrating an example of HV shifter 800 with a transistor degradation compensation module according to one embodiment of the subject matter discussed herein. The HV shifter 800 improves over the prior art HV shifter 600 with more effective compensation of PMOS transistor degradation, using substantially fewer transistors, and can reduce the size and complexity of the HV shifter.

The HV shifter 800 can includes a low-voltage control circuit 610 similar to the one in the HV shifter 600, a compensator circuit 820, and a signal transfer circuit 830. The compensator circuit 820 is an improved variant of the compensator circuit 620. The number of components have been substantially reduced. For example, transistors HVD 621A-621B, HVN 623, and HVP 622 included in the compensator circuit 620 have all been removed from the compensator circuit 820. The compensator circuit 820 includes only the HVN 651. A high-voltage control signal HV_control can be provided to couple to the gate of HVN 651 to control its conduction. Examples of a high-voltage control (HVC) signal generator circuit for generating the HV_control signal are discussed below with reference to FIGS. 9A and 10A.

The signal transfer circuit 830 is a variant of the signal transfer circuit 630 of the HV shifter 600 in FIG. 6. The signal transfer circuit 830 can include a high-voltage NMOS transistor HVD 631B and HVP 641 serially connected and coupled between the high-voltage input "FIV_input" and the output "FIV_output". The drain of HVD 631B is connected to HV_input, and the drain of HVP 641 is connected to HV_ouput. The gate of HVD 631B is connected to the source of HVN 651, such that the control signal HV_control may controllably provide Vcc to HVD 631. The HV_control signal can provide improved compensation for degradation of high-voltage transistors in the signal transfer circuit 830, such as HVP 641, represented by an increased threshold voltage. Because the compensator circuit 820 includes fewer transistors, the size and complexity of the HV shifter can be reduced. Additionally, in some examples, the compensator circuit, or the HVC signal generator circuit therein, can be placed only once in a chip. The signal HVC signal generator circuit can be coupled to a number of HV shifters, such that the HV_control signal generated therefrom can be a common signal for many HV shifters. Compared to a prior-art architecture and methods in FIGS. 5 and 6 where HV shifters has separate and distinct compensators, the HVC signal generator and one common HV_control signal supplied to multiple shifters as discussed herein can substantially reduce the shifter size, and eventually the chip size. Examples of the HVC signal generator circuit and compensation of degradation of HVP 641 are discussed below with reference to FIGS. 9-10.

Figure 9A:
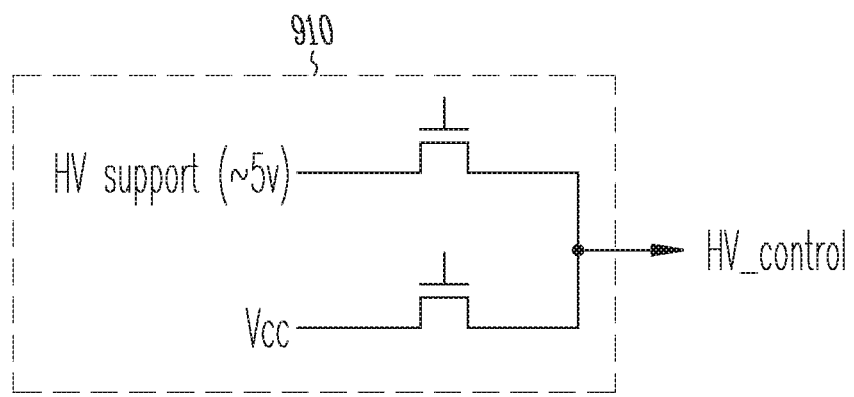
FIG. 9A illustrates an example of a high-voltage control (HVC) signal generator 910 configured to generate a control signal to compensate transistor degradation.

FIG. 9A illustrates by way of example a HVC signal generator 910 configured to provide the HV_control signal to the gate of HVN 651. The HVC signal generator 910, which can be a part of the UV shifter 800, can include a multiplexer (MUX) configured to selectively couple a high-voltage support (HV_support) signal, or the supply voltage Vcc, to the gate of HVN 651. The HV_support signal can be provided by a charge pump, an external power supply, or other high voltage source. The HV_support can be at a level higher than Vcc. In an example, the HV_support signal is approximately 5V.

Figure 9B:
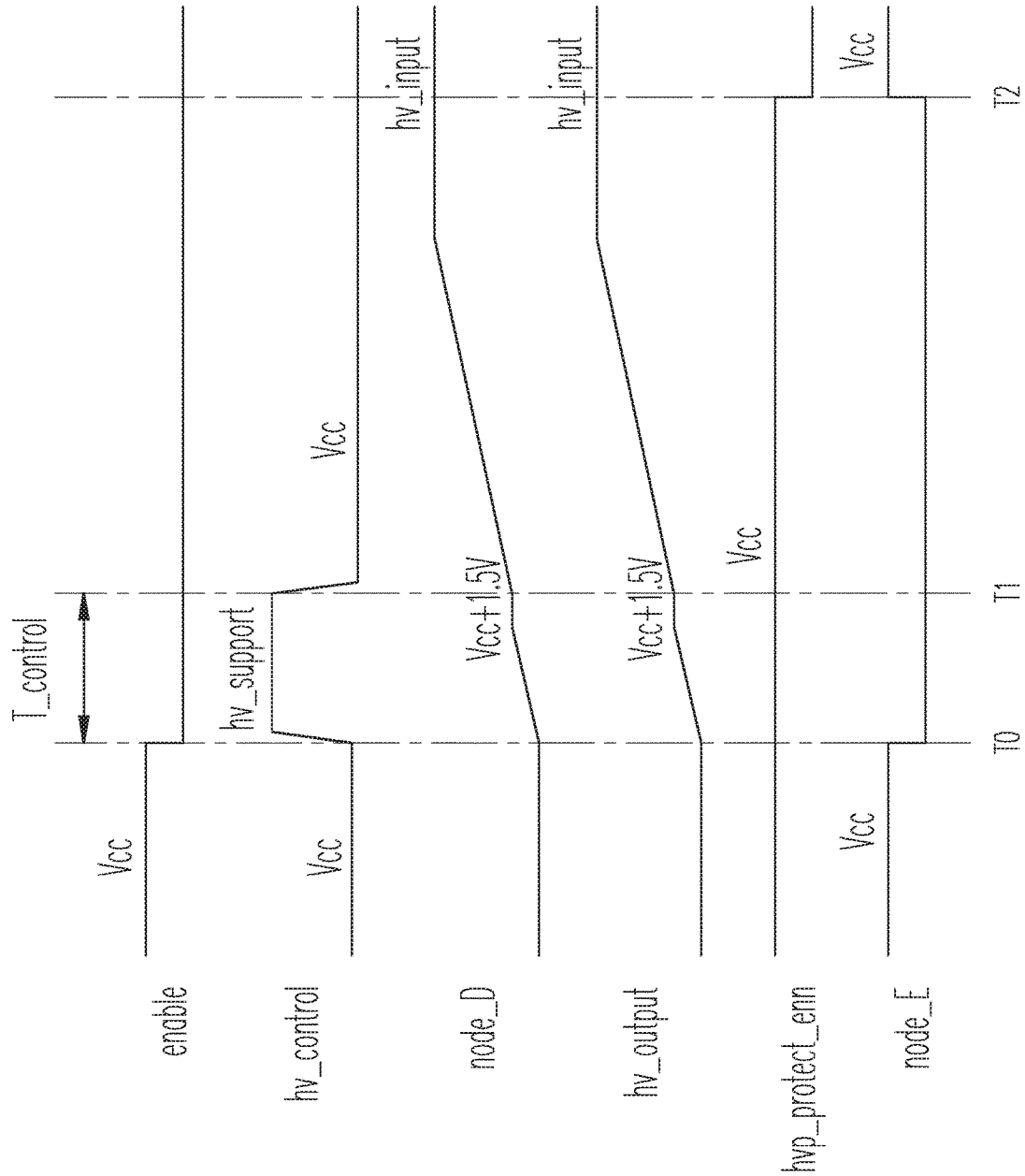
FIG. 9B is a timing diagram illustrating an operation of the HV shifter 800 including the HVC signal generator 910.

FIG. 9B is a timing diagram illustrating an operation of the HV shifter 800, in which the HV_control signal is generated by the HVC signal generator 910. Initially, during a standby state, the HVC signal generator 910 is coupled to the supply voltage Vcc, setting HV_control signal to approximately Vcc. The shifter enabling signal "enable" is also set to Vcc. NMOS 611 conducts, pulling the voltage at node 618 to the ground potential $V_{SS}$. The supply voltage Vcc at HV_control causes HVN 651 to conduct, bringing HV_output to the low potential $V_{SS}$. With the full Vcc during the initial standby state, HVP can be turned on even after the degradation. At this time, node_D is low, and node_E is high, as discussed above with reference to FIG. 6.

At time T0, the "enable" signal is flipped to a ground level $V_{SS}$, such as in response to a command to activate the present HV shifter and initiate voltage transfer from HV_input to HV_output. An example of such as a command can include a block selection signal to select a particular block of memory cells for reading, programming, or erasure. The PMOS 612 conducts, lifting the voltage at node 618 to Vcc. The MUX of the HVC signal generator 910 is switched to HV_support, a compensating voltage higher than Vcc, such as approximately 5V in an example. This HV_support turns on HVN 651, and the high voltage at 618 is transferred to the gate of HVD 631B. As HVD 631B conducts, the voltage at node_D (connected to the source of HVD 631B) increases until it is pulled up to Vcc plus the threshold voltage of the HVD 631B, which is approximately Vcc+ 1.5V, due to the negative Vth. of approximately −1.5V. As node_E stays at a logic low level and HVP 641 conducts, the HV_output follows node_D, i.e., increases to Vcc+1.5V. The voltage HV_support of approximately 5V is high enough to ensure there is no Vth drop from Vcc. The gain of no Vth drop is that it compensates the increased Vth. of HVP.

The HV_control voltage stays at HV_support for a specific time period "T_control," and then can be switched back to Vcc at time T1. The "enable" signal stays at a low potential. Similar to the discussion above with reference to FIG. 6, node_D voltage keeps rising until it reaches HV_input. HV_output follows node_D throughout this process; therefore, it also keeps rising until reaching a value of approximately HV_input.

The time period T_control during which the HV_control is switched to and stays at a higher voltage HV_control can be designed such that there is no Vth drop from Vcc at HVN 651, while at the same time, the high voltage HV_control is not applied too long to damage the low-voltage transistors in the low-voltage control circuit 610. For example, if HV_control is maintained at HV_support of 5V for too long, the low-voltage transistors in the low-voltage control circuit 610 may be damaged. In an example, the output voltage HV_output can be monitored, and T_control can be determined based on the monitored HV_ouput. In an example, the HVC signal generator 910 can switch HV_control back to Vcc by the time HV_output has reached a maximum breakdown voltage of the low-voltage transistors, which is approximately 3.6 V in an example. Then, as discussed above with reference to FIG. 7, at time T2, the compensator-enabling signal HVP_protect_enn can be reset to the ground potential $V_{SS}$. PMOS 616 conducts, and the voltage at node_E is raised to approximately Vcc. This voltage is supplied to the gate of HVP 641 to relax the gate-to-channel stress.

Figure 10A:
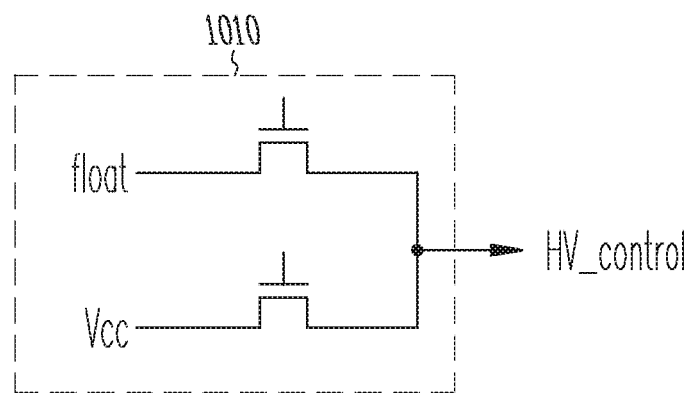
FIG. 10A illustrates another example of a HVC signal generator 1010 configured to generate a control signal to compensate transistor degradation.

FIG. 10A illustrates another example of a HVC signal generator 1010, as an alternative to the HVC signal generator 910. The HVC signal generator 1010 can be configured to produce the HV_control signal to the gate of HVN 651. The HVC signal generator 1010 can include a MUX configured to selectively couple a float signal (e.g., by setting the gate of HVN 651 float), or the supply voltage Vcc to the gate of HVN 651. With a floating gate, a self-boosted voltage of approximately Vcc boosted by the threshold voltage (Vth) of HVN 651 (i.e., Vcc+Vth) may be generated and supplied to the source of HVN 651, and applied to the gate of HVD 631B.

Figure 10B:
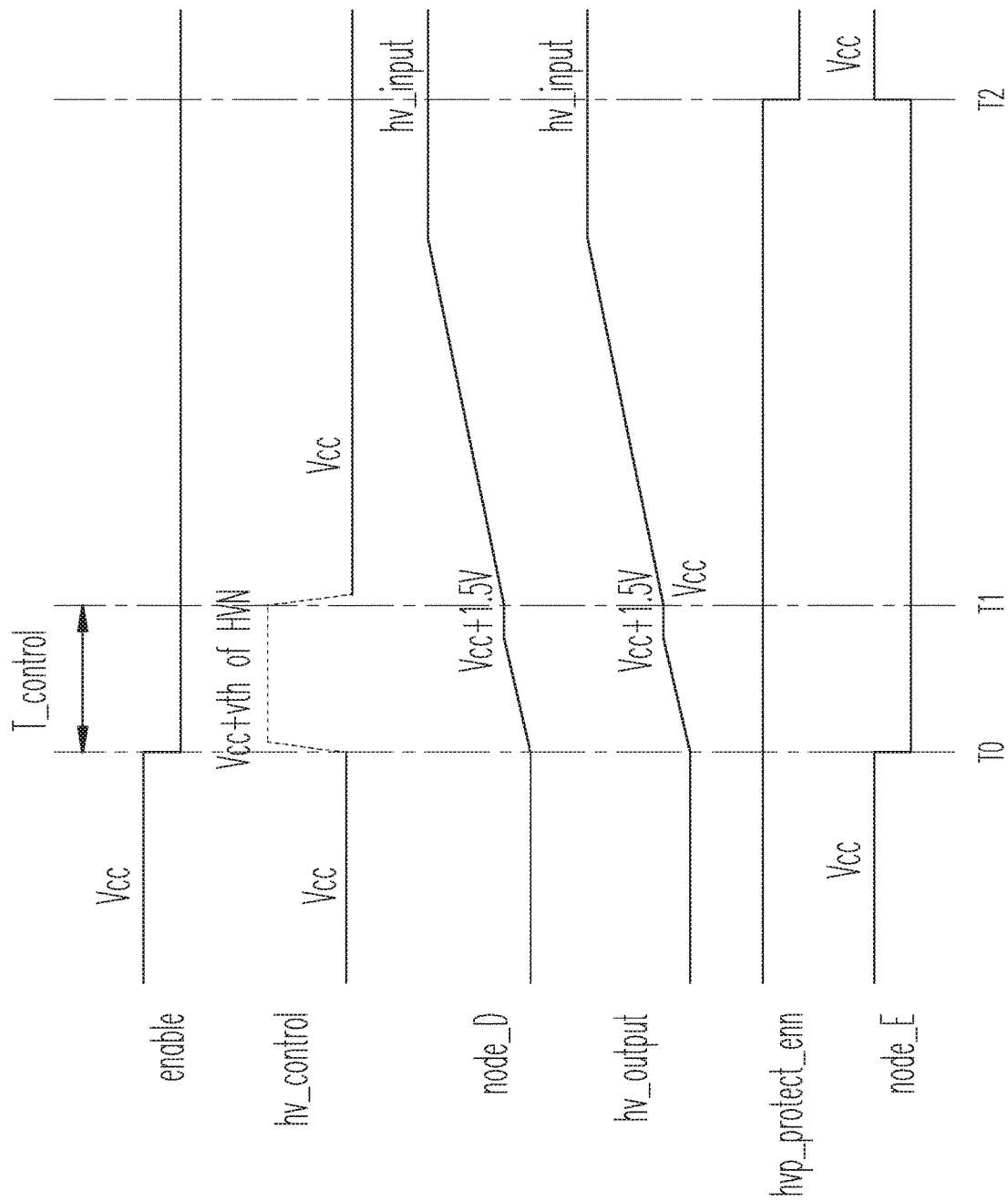
FIG. 10B is a timing diagram illustrating an operation of the HV shifter 800 including the HVC signal generator 1010.

FIG. 10B is a timing diagram illustrating an operation of the HV shifter 800 in which the HV_control signal is generated by the HVC signal generator 1010. Instead of switching to a constant high voltage HV_control to compensate for the increased Vth at HVP 641 (as shown in FIG. 7), HVC signal generator 1010 achieves PMOS degradation compensation via self-boosting by applying a floating gate-signal to the gate of HVN 651. Following time T0 and during T_control period, the HV_control is connected to the floating gate-signal. That is, HVN 651 has a floating gate. With "enable" being low at ground potential $V_{SS}$, node 618 and thus the drain of HVN rise to Vcc, the HV_control can then be self-boosted to Vcc plus the Vth (e.g., approximately 1.5V) of HVN 651. This compensation voltage, HV_control=Vcc+1.5V, is sufficient to prevent Vth drop from Vcc at HVN 651. The circuit for self-boosting is simple and easy to implement, with requiring HV_support. With self-boosting, full Vcc can be effectively transferred for the initial biasing, without any Vth drop at HVN 651.

Similar to the discussed above in reference to FIG. 9B, during the T_control time, node_E stays at a logic low level and HVP 641 conducts, the HV_output follows node_D, i.e., increases and rise up to Vcc+1.5V.

The HV_control voltage stays at HV_support for a specific time period "T_control," and then switched back to Vcc at time T1. The "enable" stays at low. Similar to the discussion above with reference to FIG. 6, node_D voltage keep rising, gradually, until it reaches HV_input. HV_output follows node_D throughout the process; therefore, it also keeps rising until reaching HV_input.

Similar to the discussion above in FIGS. 9A-9B, at time T1, the HVC signal generator 1010 switches HV_control back to Vcc by the time HV_output has reached a maximum breakdown voltage, which in an example is approximately 3.6V. Then, at time T2, the compensator-enabling signal HVP_protect_enn is reset to $V_{SS}$. PMOS 616 conducts, and raises node_E voltage to Vcc. The Vcc supplied to the gate of HVP 641 can relax the stress due to high-voltage transfer.

Compared to the HV shifter 600, the HV shifter circuit 800 has several advantages. First, it leads to a reduction in the silicon area occupied by the HV shifter circuit. Many transistors inside the HV shifter 600 for the purpose of compensating degradation can be eliminated (e.g., HV transistors 621A-621B, 622, 623, and 631A). A single HV shifter 800 can be shared by multiple memory cell array blocks, thereby reducing the chip layout area. In some examples, the compensator circuit 820, or the HVC signal generator circuit therein (e.g., MUX 910 or MUX 1010) for generating the control signal HV_control, can be placed only once in a chip, such as on a periphery area of a chip. The HV_control can be a common signal shared by two or more HV level shifters on a chip. Accordingly, overall size of a chip can be much smaller. Second, the HV shifter 800 provides for a more efficient HV level shifting circuit and method that can effectively compensate for degradation of HV transistors in the shifter circuit. Application of the control signal HV_control directly to the gate of HVN 651 can ensure full Vcc for the initial biasing. Full Vcc is high enough even after many cycles. As the result, the HV shifter can have a smaller size.

Figure 11:
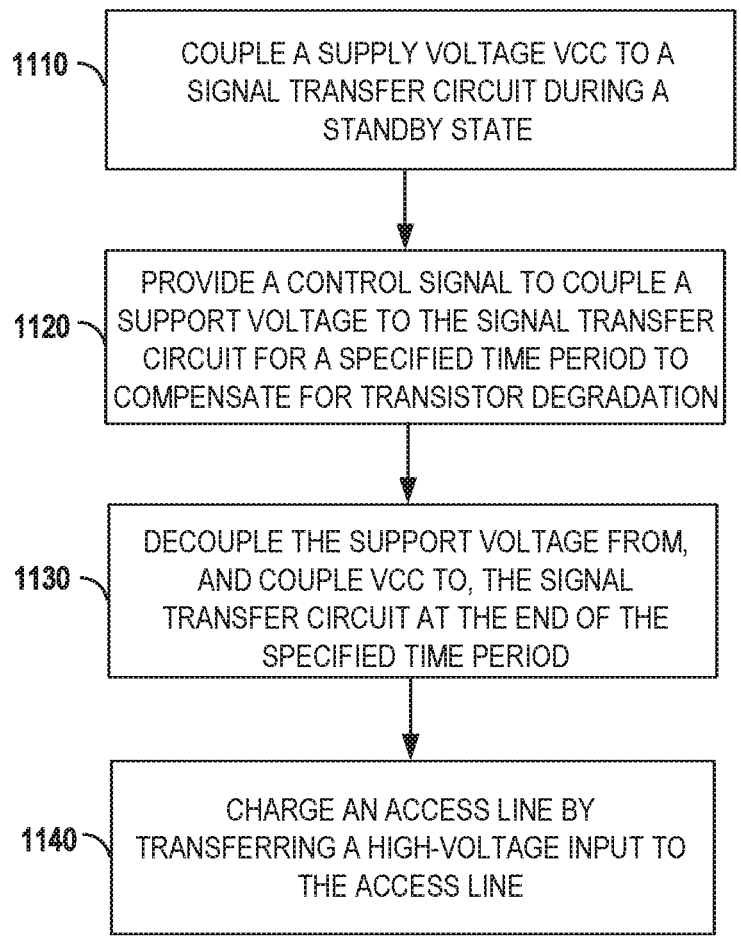
FIG. 11 is a flow chart illustrating a method of compensating component degradation in a high-voltage shifter.

FIG. 11 is a flow chart illustrating a method 1100 of compensating component degradation, such as a PMOS transistor, in a HV shifter that is used to level-shift a digital signal from one power supply to another in a memory device according to one embodiment of discussed herein, such as via the HV shifter circuit 800 of FIG. 8. Although the blocks in the method 1100 are shown in a particular order, the order of these steps can be modified. Thus, the illustrated embodiments can be performed in a different order, and some actions/blocks may be performed in parallel. Additionally, one or more actions/blocks can be omitted in various embodiments of level-shifting an input signal from one power supply level to another, such as by using the HV shifter 800. The flowchart of FIG. 11 is illustrated with reference to the embodiments of FIGS. 8-10. In an example, the method 1100 may be implemented in and executed by the HV shifter circuit 800, or embodiments or variants thereof, as discussed above.

The method 1100 commences at 1110 to couple a supply voltage Vcc to a signal transfer circuit, such as the signal transfer circuit 830, during a standby state. The transfer circuit may include a P-channel transistor c (such as HVP 641) and an N-channel transistor (such as HVD 631B) serially connected and coupled between an input port for receiving a high-voltage input and an output port for providing the transferred voltage to an access line, as illustrated in FIG. 8. The supply voltage Vcc may be controllably provided through the HVC signal generator 910, such as by activating the switch of the MUX to select the Vcc. This initial full Vcc is able to turn on HVP 641 of the signal transfer circuit, even after the degradation.

At 1120, a control signal may be provided to controllably couple a support voltage to the signal transfer circuit for a specified time period (T_control) to compensate for degradation of the P-channel transistor. The support voltage can be separate from and higher than the supply voltage Vcc. In an example, the control signal may be generated using the HVC signal generator 910, such as by activating the switch of the MUX to select HV_support, a support voltage higher than Vcc, such as approximately 5V in an example. The support voltage may be provided by coupling to a charge pump or an external power supply of a substantially constant voltage. This support voltage may cause the serially connected HVD 631B and HVP 641 to conduct, and the voltage at the output, HV_output, can rise to rise up to Vcc+1.5V, as discussed above with reference to FIG. 9B. The high compensating voltage HV_support is high enough to ensure there is no Vth drop from Vcc at HVN 651.

In another example, the control signal may be generated using the HVC signal generator 1010, such as by activating the switch of the MUX to select a float signal, that is, by setting HVN 651 with a floating gate. With a floating gate, a self-boosted voltage of approximately Vcc boosted by the threshold voltage (Vth) of HVN 651 (i.e., Vcc+Vth) may be established and applied to the serially connected HVD 631B and HVP 641. This compensation voltage, HV_control=Vcc+1.5V, is sufficient to prevent Vth drop from Vcc at HVN 651. The circuit for self-boosting is simple and easy to implement, with requiring HV_support. With self-boosting, full Vcc can be effectively transferred for the initial biasing, without any Vth drop at HVN 651.

The time period T_control during which the HV_control is switched to and stays at a higher voltage HV_control can be designed such that there is no Vth drop from Vcc at HVN 651, while at the same time, the high voltage HV_control is not applied too long to damage the low-voltage transistors in the low-voltage control circuit 610. In an example, the output voltage HV_output can be monitored, and the decoupling from the support voltage and coupling the supply voltage Vcc to the signal transfer circuit can be initiated when the output voltage reaches a specified maximum low-voltage transistor breakdown voltage. In an example, the maximum breakdown voltage is approximately 3.6 V.

At 1130, at the end of the specified time period T_control, the support voltage HV_control can be decoupled from the signal transfer circuit, and supply voltage Vcc can be coupled to the signal transfer circuit. This can effectively protect low-voltage transistor from breaking down. As discussed above in reference FIG. 9B, the serially connected HVD 631B and HVP 641 remain conducted, and the output voltage HV_output can keep rising after the T_control period, until reaching HV_input. After that, the compensator-enabling signal HVP_protect_enn is reset to ground potential $V_{SS}$. Vcc is applied to the gate of HVP 641 to relax the gate-to-channel stress due to high-voltage transfer.

At 1140, one or more access lines may be charged up by transferring the high-voltage input to the access line. The access line, such as a word line (WL) or a global word line (GWL), may be coupled to one or more of the group of memory cells. By charging the WL or GWL to desired voltage, one or more of the group of memory cells may be selectively read, programmed, or erased, among other memory cell operations.

Figure 12:
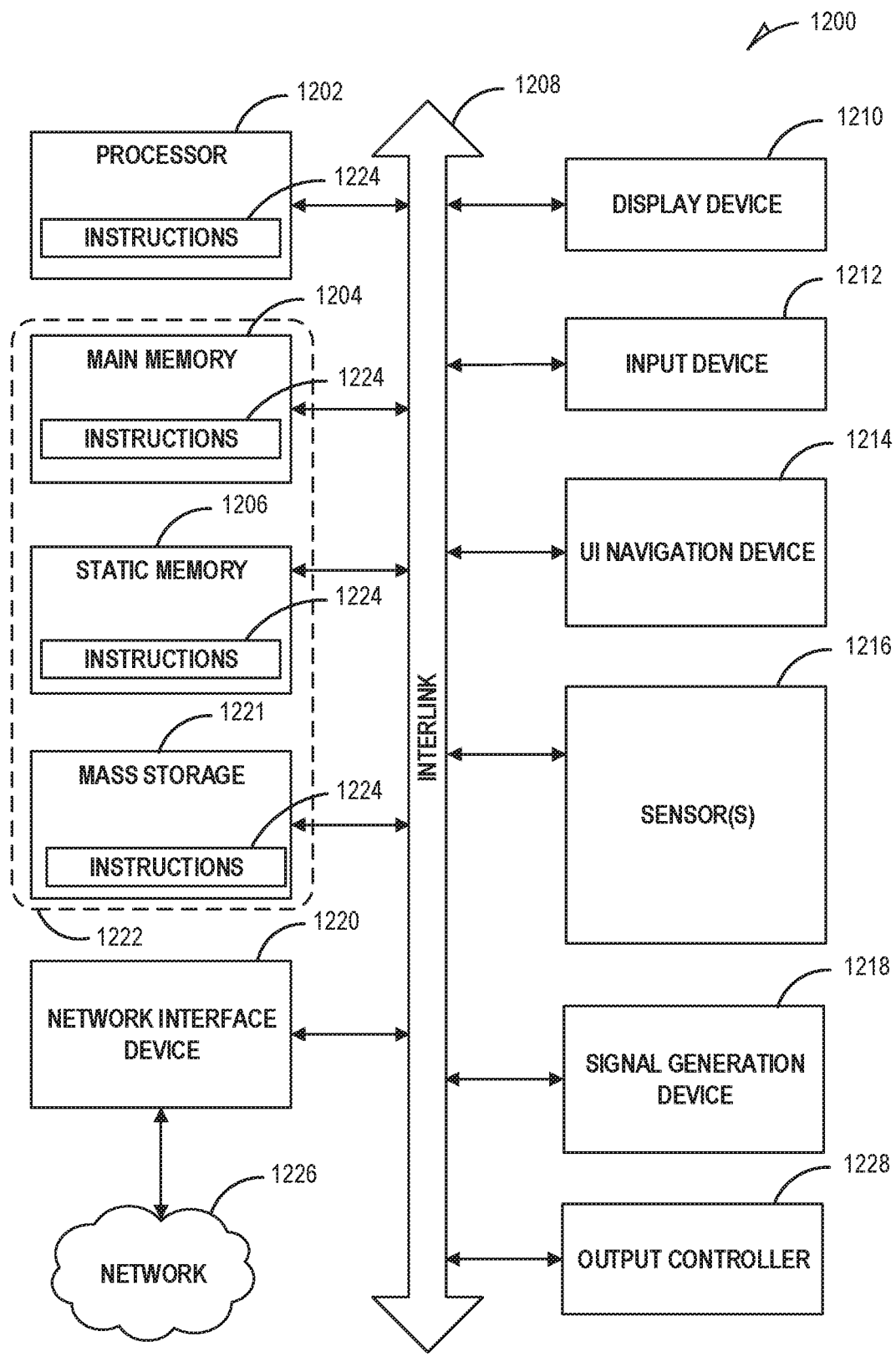
FIG. 12 is a block diagram illustrating an example of a machine upon which one or more embodiments may be implemented.

FIG. 12 illustrates a block diagram of an example machine 1200 upon which any one or more of the techniques (e.g., methodologies) discussed herein may perform. In alternative embodiments, the machine 1200 may operate as a standalone device or may be connected (e.g., networked) to other machines. In a networked deployment, the machine 1200 may operate in the capacity of a server machine, a client machine, or both in server-client network environments. In an example, the machine 1200 may act as a peer machine in peer-to-peer (P2P) (or other distributed) network environment. The machine 1200 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1200 (e.g., the host device 105, the memory device 110, etc.) may include a hardware processor 1202 (e.g., a central processing unit (CPU), a graphics processing unit (GPU), a hardware processor core, or any combination thereof, such as the memory controller 115, etc.), a main memory 1204 and a static memory 1206, some or all of which may communicate with each other via an interlink (e.g., bus) 1208. The machine 1200 may further include a display unit 1210, an alphanumeric input device 1212 (e.g., a keyboard), and a user interface (UI) navigation device 1214 (e.g., a mouse). In an example, the display unit 1210, input device 1212 and UI navigation device 1214 may be a touch screen display. The machine 1200 may additionally include a signal generation device 1218 (e.g., a speaker), a network interface device 1220, and one or more sensors 1216, such as a global positioning system (GPS) sensor, compass, accelerometer, or other sensor. The machine 1200 may include an output controller 1228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1200 may include a machine readable medium 1222 on which is stored one or more sets of data structures or instructions 1224 (e.g., software) embodying or utilized by any one or more of the techniques or functions described herein. The instructions 1224 may also reside, completely or at least partially, within the main memory 1204, within static memory 1206, or within the hardware processor 1202 during execution thereof by the machine 1200. In an example, one or any combination of the hardware processor 1202, the main memory 1204, or the static memory 1206 may constitute the machine readable medium 1222.

While the machine readable medium 1222 is illustrated as a single medium, the term "machine readable medium" may include a single medium or multiple media (e.g., a centralized or distributed database, and/or associated caches and servers) configured to store the one or more instructions 1224.

The term "machine readable medium" may include any medium capable of storing or encoding instructions for execution by the machine 1200 and that cause the machine 1200 to perform any one or more of the techniques of the present disclosure, or capable of storing, encoding or carrying data structures used by or associated with such instructions. Non-limiting machine readable medium examples include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1224 (e.g., software, programs, an operating system (OS), etc.) or other data are stored on the storage device 1221, can be accessed by the memory 1204 for use by the processor 1202. The memory 1204 (e.g., DRAM) is typically fast, but volatile, and thus a different type of storage than the storage device 1221 (e.g., an SSD), which is suitable for long-term storage, including while in an "off" condition. The instructions 1224 or data in use by a user or the machine 1200 are typically loaded in the memory 1204 for use by the processor 1202. When the memory 1204 is full, virtual space from the storage device 1221 can be allocated to supplement the memory 1204; however, because the storage 1221 device is typically slower than the memory 1204, and write speeds are typically at least twice as slow as read speeds, use of virtual memory can greatly reduce user experience due to storage device latency (in contrast to the memory 1204, e.g., DRAM). Further, use of the storage device 1221 for virtual memory can greatly reduce the usable lifespan of the storage device 1221.

In contrast to virtual memory, virtual memory compression (e.g., the Linux® kernel feature "ZRAM") uses part of the memory as compressed block storage to avoid paging to the storage device 1221. Paging takes place in the compressed block until it is necessary to write such data to the storage device 1221. Virtual memory compression increases the usable size of memory 1204, while reducing wear on the storage device 1221.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1224 may further be transmitted or received over a communications network 1226 using a transmission medium via the network interface device 1220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1220 may include one or more physical jacks (e.g., Ethernet, coaxial, or phone jacks) or one or more antennas to connect to the communications network 1226. In an example, the network interface device 1220 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1200, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a memory device that comprises a group of memory cells and a high-voltage shifter circuit. The high-voltage shifter circuit can include a signal transfer circuit and a compensator circuit. The signal transfer circuit includes a P-channel transistor coupled between an input port and an output port of the high-voltage shifter circuit, the P-channel transistor configured to transfer a high-voltage input received at the input port to an access line coupled to one or more of the group of memory cells. The compensator circuit is configured to provide a control signal to the signal transfer circuit by coupling a support voltage, separate from and higher than a supply voltage (Vcc), to the signal transfer circuit for a specified time period to compensate for degradation of the P-channel transistor.

In Example 2, the subject matter of Example 1 optionally includes the compensator circuit that can be configured to decouple from the support voltage, and couple the supply voltage (Vcc) to the signal transfer circuit after the specified time period.

In Example 3, the subject matter of any one or more of Examples 1-2 optionally includes the signal transfer circuit that further includes a first N-channel transistor having a gate coupled to the control signal. The first N-channel transistor and the P-channel transistor can be serially connected and coupled between the input port and the output port of the high-voltage shifter circuit.

In Example 4, the subject matter of Example 3 optionally includes the P-channel transistor that can be a high-voltage PMOS transistor with a positive threshold voltage. The N-channel transistor can be a high-voltage NMOS transistor with a negative threshold voltage.

In Example 5, the subject matter of any one or more of Examples 1-4 optionally includes the compensator circuit that can include a high-voltage control (HVC) signal generator and a second N-channel transistor. The HVC signal generator is configured to generate the control signal, and couple the control signal to a gate of the second N-channel transistor. The second N-channel transistor has a source connected to a gate of the first N-channel transistor.

In Example 6, the subject matter of Example 5 optionally includes the HVC signal generator that can include a multiplexer (MUX) configured to select between the supply voltage (Vcc) and the support voltage.

In Example 7, the subject matter of Example 6 optionally includes the support voltage that can be a charge pump or an external power supply.

In Example 8, the subject matter of Example 6 optionally includes the support voltage that can be a self-boosted voltage provided by the second N-channel transistor with a floating gate. The self-boosted voltage includes the supply voltage (Vcc) boosted by a threshold voltage (Vth) of the second N-channel transistor.

In Example 9, the subject matter of any one or more of Examples 6-8 optionally includes the HVC signal generator that can be configured to select the supply voltage (Vcc) during a standby state, and to switch to the support voltage in response to a shifter-enabling signal to compensate for degradation of the P-channel transistor during the specified time period.

In Example 10, the subject matter of Example 9 optionally includes the specified time period that can be a predetermined time period. The HVC signal generator can be configured to switch to the supply voltage (Vcc) after the predetermined time period.

In Example 11, the subject matter of any one or more of Examples 9-10 optionally includes the HVC signal generator that can be configured to switch to the supply voltage (Vcc) in response to an output voltage at the output port reaching a maximum breakdown voltage of low-voltage transistors in the high-voltage shifter circuit.

In Example 12, the subject matter of any one or more of Examples 5-11 optionally includes the HVC signal generator that can be configured to couple to two or more high-voltage shifters.

In Example 13, the subject matter of any one or more of Examples 1-12 optionally includes the access line that can be configured to connect to the output port of the high-voltage shifter circuit. The signal transfer circuit can be configured to charge the access line using the transferred high-voltage input.

In Example 14, the subject matter of any one or more of Examples 1-13 optionally includes the access line that can include a word line or a global word line.

Example 15 is a method of compensating degradation of a P-channel transistor of a signal transfer circuit in a high-voltage shifter of a memory device comprising a group of memory cells. The method comprises steps of: coupling a supply voltage (Vcc) to the signal transfer circuit during a standby state, the signal transfer circuit including serially connected a first N-channel transistor and the P-channel transistor; in response to a shifter-enabling signal, providing a control signal, via a compensator circuit of the high-voltage shifter, to controllably couple a support voltage, separate from and higher than the supply voltage (Vcc), to the signal transfer circuit for a specified time period to compensate for degradation of the P-channel transistor; and charging an access line, via the signal transfer circuit, by transferring a high-voltage input to the access line coupled to one or more of the group of memory cells.

In Example 16, the subject matter of Example 15 optionally includes, at the end of the specified time period, decoupling the support voltage from, and coupling the supply voltage (Vcc) to, the signal transfer circuit.

In Example 17, the subject matter of any one or more of Examples 15-16 optionally includes monitoring an output voltage of the high-voltage shifter, and decoupling from the support voltage and coupling the supply voltage (Vcc) to the signal transfer circuit in response to the output voltage reaching a maximum breakdown voltage of low-voltage transistors in the signal transfer circuit.

In Example 18, the subject matter of any one or more of Examples 15-17 optionally include generating the control signal using a high-voltage control (HVC) signal generator by selectively coupling to the supply voltage (Vcc) during the standby state, or providing the support voltage in response to the shifter-enabling signal.

In Example 19, the subject matter of Example 18 optionally includes providing the support voltage by coupling to a charge pump or an external power supply.

In Example 20, the subject matter of Example 18 optionally includes providing the support voltage by self-boosting a second N-channel transistor, coupled to the HVC signal generator, with a floating gate.

The invention claimed is:

1. A memory device, comprising:
a group of memory cells; and
a high-voltage shifter circuit, including:
a signal transfer circuit including a P-channel transistor coupled between an input port and an output port of the high-voltage shifter circuit, the P-channel transistor configured to transfer a high-voltage input received at the input port to an access line coupled to one or more of the group of memory cells; and
a compensator circuit configured to provide a control signal to the signal transfer circuit by coupling a support voltage, separate from and higher than a supply voltage (Vcc), to the signal transfer circuit for a specified time period to compensate for degradation of the P-channel transistor;
wherein the signal transfer circuit includes a first N-channel transistor having a gate coupled to the control signal, the first N-channel transistor and the P-channel transistor serially connected and coupled between the input port and the output port of the high-voltage shifter circuit; and
wherein the compensator circuit includes a second N-channel transistor having a gate coupled to the control signal and a source connected to the gate of the first N-channel transistor.

2. The memory device of claim 1, wherein the compensator circuit is configured to decouple from the support voltage, and couple the supply voltage (Vcc) to the signal transfer circuit after the specified time period.

3. The memory device of claim 1, wherein the P-channel transistor is a high-voltage PMOS transistor with a positive threshold voltage, and the N-channel transistor is a high-voltage NMOS transistor with a negative threshold voltage.

4. The memory device of claim 1, wherein the compensator circuit includes a high-voltage control (HVC) signal generator configured to generate the control signal, and couple the control signal to the gate of the second N-channel transistor.

5. The memory device of claim 4, wherein the HVC signal generator includes a multiplexer (MUX) configured to select between the supply voltage (Vcc) and the support voltage.

6. The memory device of claim 5, wherein the support voltage is a charge pump or an external power supply.

7. The memory device of claim 5, wherein the support voltage is a self-boosted voltage provided by the second N-channel transistor with a floating gate, the self-boosted voltage including the supply voltage (Vcc) boosted by a threshold voltage (Vth) of the second N-channel transistor.

8. The memory device of claim 5, wherein the HVC signal generator is configured to select the supply voltage (Vcc) during a standby state, and to switch to the support voltage in response to a shifter-enabling signal to compensate for degradation of the P-channel transistor during the specified time period.

9. The memory device of claim 8, wherein the specified time period is a predetermined time period, and the HVC signal generator is configured to switch to the supply voltage (Vcc) after the predetermined time period.

10. The memory device of claim 8, wherein the HVC signal generator is configured to switch to the supply voltage (Vcc) in response to an output voltage at the output port reaching a maximum breakdown voltage of low-voltage transistors in the high-voltage shifter circuit.

11. The memory device of claim 4, wherein the HVC signal generator is configured to couple to two or more high-voltage shifters.

12. The memory device of claim 1, wherein the access line is configured to connect to the output port of the high-voltage shifter circuit, and the signal transfer circuit is configured to charge the access line using the transferred high-voltage input.

13. The memory device of claim 1, wherein the access line includes a word line or a global word line.

14. A method of compensating degradation of a P-channel transistor of a signal transfer circuit in a high-voltage shifter of a memory device comprising a group of memory cells, the method comprising:
- coupling a supply voltage (Vcc) to the signal transfer circuit during a standby state, the signal transfer circuit including serially connected a first N-channel transistor and the P-channel transistor;
- in response to a shifter-enabling signal, providing a control signal, via a compensator circuit of the high-voltage shifter, to controllably couple a support voltage, separate from and higher than the supply voltage (Vcc), to the signal transfer circuit via a gate of the first N-channel transistor for a specified time period to compensate for degradation of the P-channel transistor, the compensator including a second N-channel transistor having a gate coupled to the control signal and a source connected to the gate of the first N-channel transistor; and
- charging an access line, via the signal transfer circuit, by transferring a high-voltage input to the access line coupled to one or more of the group of memory cells.

15. The method of claim 14, comprising, at the end of the specified time period, decoupling the support voltage from, and coupling the supply voltage (Vcc) to, the signal transfer circuit.

16. The method of claim 14, comprising monitoring an output voltage of the high-voltage shifter, and decoupling from the support voltage and coupling the supply voltage (Vcc) to the signal transfer circuit in response to the output voltage reaching a maximum breakdown voltage of low-voltage transistors in the signal transfer circuit.

17. The method of claim 14, comprising generating the control signal using a high-voltage control (HVC) signal generator by selectively coupling to the supply voltage (Vcc) during the standby state, or providing the support voltage in response to the shifter-enabling signal.

18. The method of claim 17, wherein providing the support voltage includes coupling to a charge pump or an external power supply.

19. The method of claim 17, wherein providing the support voltage includes self-boosting a second N-channel transistor, coupled to the HVC signal generator, with a floating gate.

20. The method of claim 17, comprising coupling an output port of the high-voltage shifter circuit to the access line to charge the access line using the transferred high-voltage input.

* * * * *